(12) United States Patent
Turpin

(10) Patent No.: US 8,452,571 B2
(45) Date of Patent: May 28, 2013

(54) TRIGGER FIGURE-OF-MERIT INDICATOR

(75) Inventor: John F. Turpin, Tigard, OR (US)

(73) Assignee: Tektronix, Inc, Beaverton, OR (US)

( * ) Notice: Subject to any disclaimer, the term of this patent is extended or adjusted under 35 U.S.C. 154(b) by 500 days.

(21) Appl. No.: 12/724,683

(22) Filed: Mar. 16, 2010

(65) Prior Publication Data

US 2011/0231156 A1  Sep. 22, 2011

(51) Int. Cl.
*G06F 17/40* (2006.01)

(52) U.S. Cl.
USPC ............... 702/187; 702/32; 702/77; 702/189; 702/190; 702/193

(58) Field of Classification Search
USPC ....... 702/187, 32, 77, 189, 190, 193; 324/653
See application file for complete search history.

(56) References Cited

U.S. PATENT DOCUMENTS

| 4,642,519 | A | 2/1987 | Nakatsugawa et al. | |
|---|---|---|---|---|
| 6,624,829 | B1 * | 9/2003 | Beck et al. | 715/771 |
| 2006/0129355 | A1 | 6/2006 | Hillman, Jr. et al. | |
| 2009/0094495 | A1 * | 4/2009 | Torin | 714/732 |
| 2010/0231398 | A1 | 9/2010 | Engholm et al. | |

FOREIGN PATENT DOCUMENTS

EP  2048509 A1  4/2009

* cited by examiner

*Primary Examiner* — Elias Desta
(74) *Attorney, Agent, or Firm* — Michael A. Nelson

(57) ABSTRACT

A real-time trigger figure-of-merit indicator for test and measurement instruments provides an indication of how close a signal-under-test is to satisfying a relevant trigger condition. The indicator includes a first marker that indicates a real-time trigger figure-of-merit that is calculated based on digital samples that represent the signal-under-test, and a second marker that indicates a level that the figure-of-merit must exceed in order for a trigger event detector to detect a trigger event and generate a trigger signal. Thus, by observing the indicator, a user may easily ascertain how close a signal-under-test is to satisfying the relevant trigger condition without requiring the instrument to actually trigger.

6 Claims, 2 Drawing Sheets

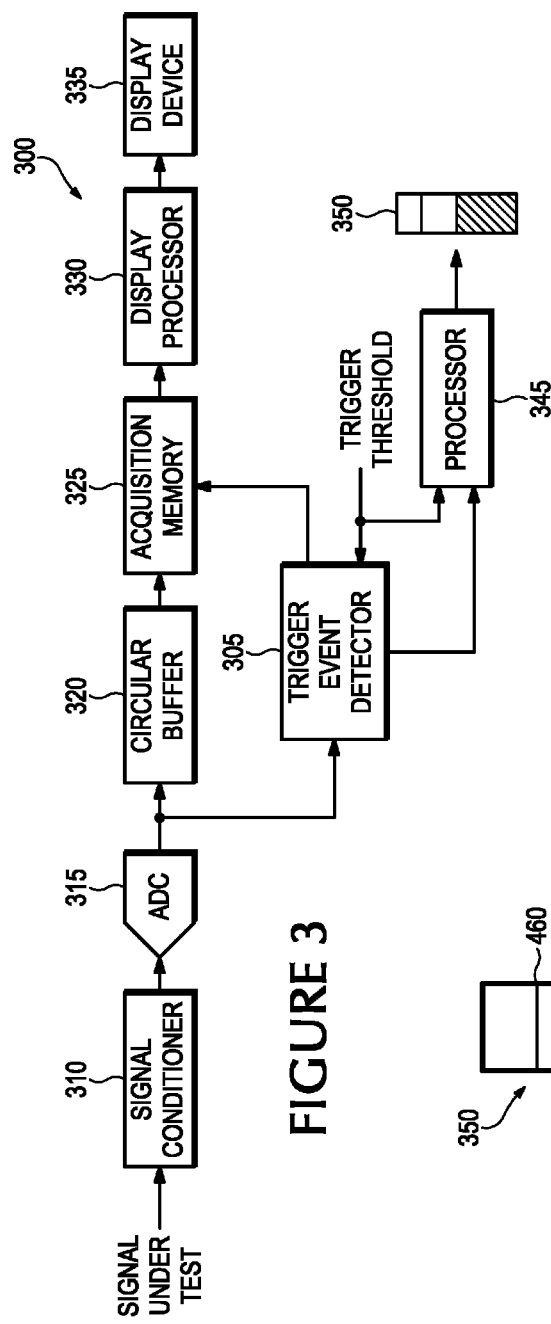
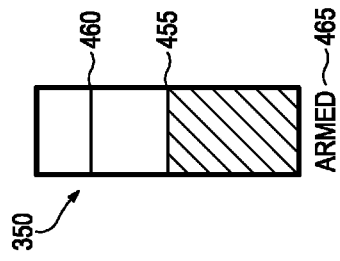
FIGURE 3
FIGURE 4

TRIGGER FIGURE-OF-MERIT INDICATOR

FIELD OF THE INVENTION

The present invention relates to test and measurement instruments, and more particularly to tools that make it easier for a user to set up and arm a trigger event detector.

BACKGROUND OF THE INVENTION

Test and measurement instruments such as spectrum analyzers, oscilloscopes, and logic analyzers have "trigger event detectors" that allow them to capture and analyze portions of a signal-under-test before, at, and after specific events occur referred to as "trigger events." Trigger events can be detected from the signal-under-test itself or from a secondary signal. In order to insure a high probability of detecting a trigger event, a trigger event detector must operate continuously, regardless of whether a trigger event is present or not. FIG. 1 illustrates a spectrum analyzer 100 having such a trigger event detector 105. In operation, a signal-under-test is conditioned by a signal conditioner 110 (e.g., by down-converting the signal-under-test from RF to IF) and then digitized by an analog-to-digital converter (ADC) 115 to produce a continuous stream of digitized samples. The digitized samples are written into a circular buffer 120 and also input to the trigger event detector 105. The trigger event detector 105 processes the digital samples and then compares the processed samples to a user-specified trigger threshold. When the processed digital samples exceed the trigger threshold, the trigger event generator 105 generates a trigger signal that causes an acquisition memory 125 to capture the digitized samples that are held in the circular buffer 120. The captured samples are then analyzed by a display processor 130 (e.g., by transforming them into the frequency domain using a frequency transform such as a fast Fourier transform (FFT), a chirp-Z transform, or the like) and displayed on a display device 135. The trigger event detector 105 may be any one of various kinds of trigger event detectors that are used to detect various kinds of trigger events. For example, the trigger event detector 105 may be a "power level trigger" that detects when the instantaneous power of the signal-under-test exceeds a user-specified power threshold. In that case, the trigger event detector 105 processes the digitized samples by converting them into a measure of the instantaneous power of the signal-under-test, and the user-specified trigger threshold is a power threshold. When the instantaneous power of the signal-under-test exceeds the power threshold, the trigger event generator 105 generates the trigger signal.

In order to detect more complex trigger events, a trigger event detector may need to be more selective than the acquisition path of the instrument (i.e., the signal conditioner, ADC, circular buffer, acquisition memory, and so on). For example, as shown in FIG. 2, a spectrum analyzer 200 may include a band-pass filter (BPF) 240 that filters the signal-under-test before it is applied to the trigger event detector 205 so that the trigger event detector 205 only detects trigger events within a narrow range of frequencies (as described in U.S. Pat. No. 5,493,209 titled "Tunable trigger acquisition system and method for making in-service time-domain signal measurements"). In this manner, the bandwidth of the signal received by the trigger event detector 205 is much narrower than the bandwidth of the signal-under-test displayed on the display device 235.

The deficiency in these conventional instruments is that it is difficult for a user to ascertain how to set up and arm the trigger event detector. That is, the user cannot see the signal-under-test on the display device until a trigger event occurs. Thus, if the trigger event detector is set up improperly or if the signal-under-test changes after the user arms the trigger event detector, then the user has no way of ascertaining why the instrument is not triggering. This deficiency is particularly problematic in the case where the trigger event detector is more selective than the acquisition path of the instrument because, even if the user can somehow get the instrument to display the signal-under-test (e.g., by forcing a trigger), the signal-under-test shown on the display device does not necessarily correspond to the signal received by the trigger event detector.

SUMMARY OF THE INVENTION

What is needed is a way for a user to easily ascertain how close a signal-under-test is to satisfying a relevant trigger condition.

Accordingly, embodiments of the present invention provide a real-time trigger figure-of-merit indicator for test and measurement instruments that provides an indication of how close a signal-under-test is to satisfying a relevant trigger condition. The indicator includes a first marker that indicates a real-time trigger figure-of-merit that is calculated based on digital samples that represent the signal-under-test, and a second marker that indicates a level that the figure-of-merit must exceed in order for a trigger event detector to detect a trigger event and generate a trigger signal. Thus, by observing the indicator, a user may easily ascertain how close a signal-under-test is to satisfying the relevant trigger condition without requiring the instrument to actually trigger.

The objects, advantages and other novel features of the present invention are apparent from the following detailed description when read in conjunction with the appended claims and attached drawing.

BRIEF DESCRIPTION OF THE DRAWINGS

FIG. 3 depicts a high-level block diagram of a spectrum analyzer having a real-time trigger figure-of-merit indicator according to an embodiment of the present invention.

FIG. 4 depicts a more detailed view of the real-time trigger figure-of-merit indicator shown in FIG. 3.

DETAILED DESCRIPTION OF THE INVENTION

Figure 1:
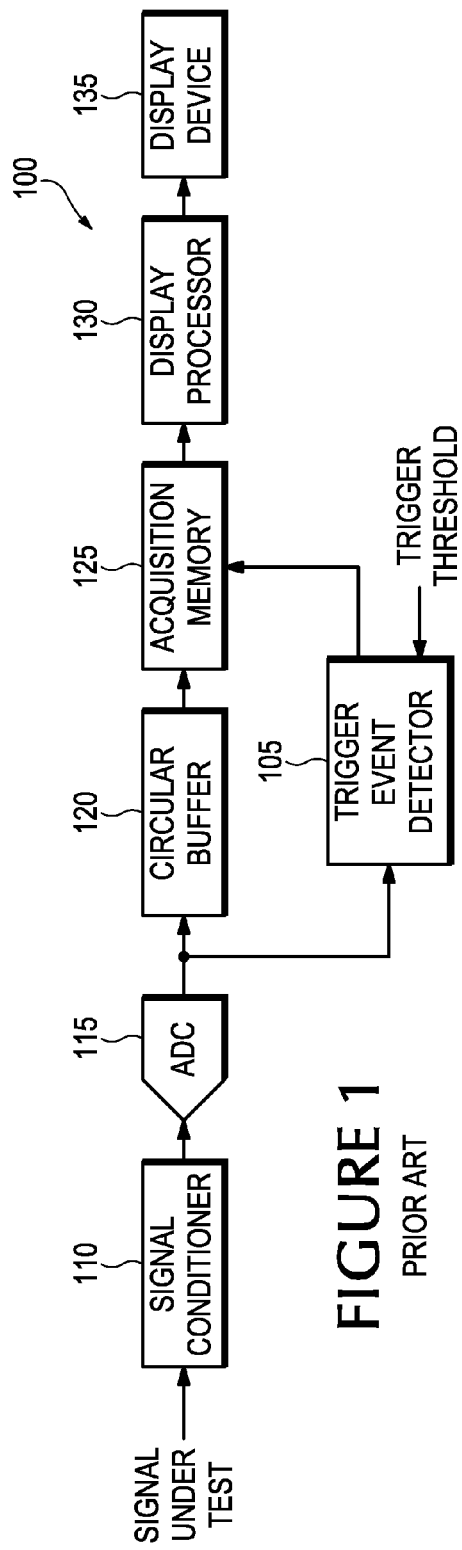
FIG. 1 depicts a high-level block diagram of a conventional spectrum analyzer having a power level trigger.
Figure 2:
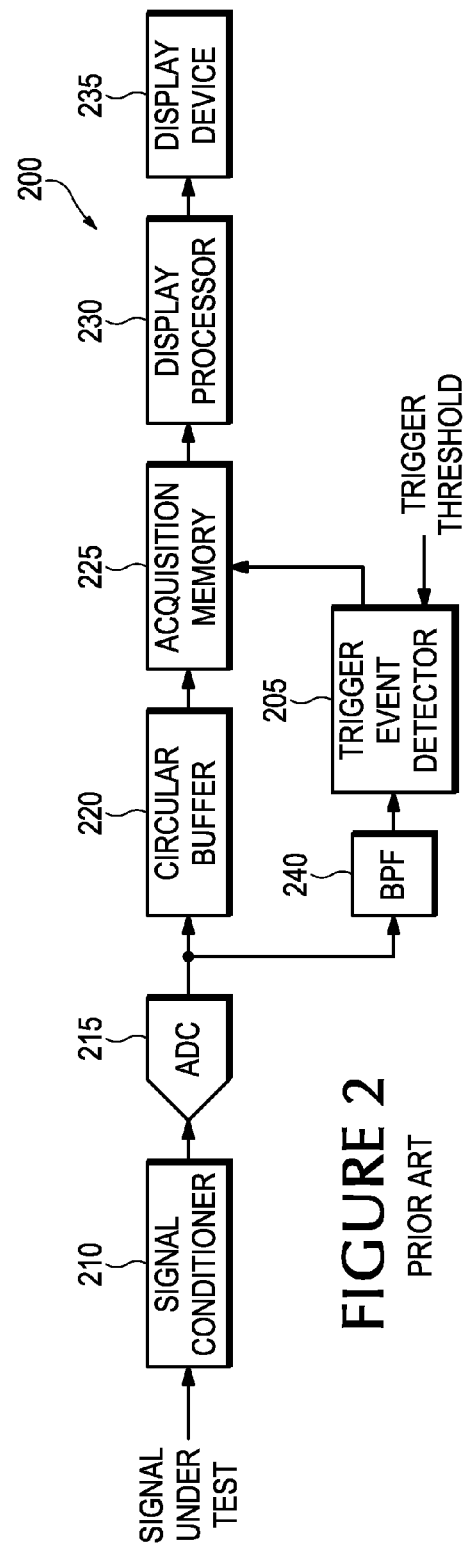
FIG. 2 depicts a high-level block diagram of a conventional spectrum analyzer having a filtered power level trigger.

Referring now to FIG. 3, a spectrum analyzer 300 according to an embodiment of the present invention is similar to the spectrum analyzer 100 shown in FIG. 1 but also includes a processor 345 that receives a copy of the processed digital samples from the trigger event detector 305 and a copy of the user-specified trigger threshold, and generates based on them a real-time trigger figure-of-merit indicator 350 that indicates how close the signal-under-test is to satisfying a relevant trigger condition. Referring now to FIG. 4, the indicator 350 includes a first marker 455 that indicates a real-time trigger "figure-of-merit" that is calculated based on the processed digital samples. For example, if the trigger event detector 305 is a power level trigger, then the figure-of-merit is the instantaneous power of the signal-under-test. Similarly, if the trigger event detector 305 is a filtered power level trigger, then the figure-of-merit is the instantaneous power of the filtered signal-under-test. The indicator 350 also includes a second marker 460 that indicates a level that the figure-of-merit must exceed in order for the trigger event detector 305 to detect a trigger event and generate a trigger signal. For example, if the trigger event detector 305 is a power level trigger or filtered power level trigger, then the marker 460 indicates the user-specified power threshold. Optionally, the indicator 350 may also include a third marker 465 that indicates the state of the trigger event detector 305, i.e., "armed", "ready", "triggered," and so on. The indicator 350 may be displayed on the display device 335, on a front-panel of the instrument (not shown), or in cases where the instrument is controlled by a remote computer (not shown), the indicator 350 may be displayed on a display device of that computer. Thus, by simply observing the indicator 350, a user may easily ascertain how close the signal-under-test is to satisfying a relevant trigger condition. This is particularly advantageous for instruments in which the trigger event detector is more selective than the acquisition path of the instrument.

The real-time trigger figure-of-merit is not only useful when used in conjunction with a power level trigger and a filtered power level trigger, but in various other embodiments may be adapted to be used with any type of trigger event detector. For example:

In another embodiment, the trigger event detector 305 is a "frequency mask trigger" as described in U.S. Pat. No. 5,103,402 titled "Method and apparatus for identifying, saving, and analyzing continuous frequency domain data in a spectrum analyzer" which transforms the digitized samples of the signal-under-test into a continuous series of frequency spectra and generates a trigger signal when a frequency spectrum violates a user-defined frequency mask. In that case, the processed digital samples are the frequency spectra and the user-specified trigger threshold is the frequency mask. The marker 455 indicates the value of the spectrum that is closest to the frequency mask, and the marker 460 indicates the corresponding value of the frequency mask.

In another embodiment, the trigger event detector 305 is a "density trigger" as described in co-pending U.S. application Ser. No. 12/568,141 titled "Frequency Domain Bitmap Triggering Using Color, Density and Correlation Based Triggers" which generates a trigger signal when the sample density within a user-defined density marker box exceeds a user-specified density threshold. In that case, the processed digital samples are the instantaneous density within the density marker box and the user-specified trigger threshold is the density threshold. The marker 455 indicates the instantaneous value of the density, and the marker 460 indicates the density threshold.

In another embodiment, the trigger event detector 305 is an "external trigger" which generates a trigger signal when the voltage sensed at an external trigger input connector (not shown) exceeds a user-specified voltage threshold. In this case, the processor 345 does not receive the processed digital samples from the trigger event detector 305, but rather receives the voltage sensed at the external trigger input connector, and the user-specified trigger threshold is the voltage threshold. The marker 455 indicates the instantaneous voltage sensed at the external trigger input connector, and the marker 460 indicates the voltage threshold.

In another embodiment, the trigger event detector 305 is a "modulation domain trigger" as described in co-pending U.S. application Ser. No. 11/009,161 titled "Modulation domain trigger" which transforms the digitized samples of the signal-under-test into the modulation domain and generates a trigger signal when an anomaly is detected. In that case, the figure-of-merit may be any one of various signal quality measurements such as error vector magnitude (EVM), phase error, magnitude error, in-phase/quadrature (I/Q) imbalance, skew, origin offset, number of bits per second, packets per second, and so on. In general, any quantifiable aspect of the signal may be used as a figure-of-merit.

It will be appreciated that the list of trigger event detectors described above is not an exhaustive list, and that a real-time trigger figure-of-merit indicator may be used in conjunction with any kind of trigger event detector now existing or yet to be developed without departing from the spirit and scope of the invention. That is, regardless of the particular trigger condition that a trigger event detector uses, a real-time trigger figure-of-merit indicator can be used to provide a real-time indication of how close a signal-under-test is to satisfying that trigger condition. For example, if a trigger event detector generates a trigger signal when an aspect of a signal-under-test "matches" a specified condition (such as a specified data pattern, a specified spectral signature, or the like), then the real-time trigger figure-of-merit indicator may indicate "nearness of match," "degree-of-match," or the like. Furthermore, some types of trigger event detectors may have more than one figure-of-merit. Multiple indicators may be used with those types of trigger event detectors, one for each figure-of-merit.

Although the real-time trigger figure-of-merit indicator was described above as being used in conjunction with a spectrum analyzer, it will be appreciated that in various other embodiments a real-time trigger figure-of-merit indicator may be used in conjunction with any other kind of test and measurement instrument that uses a trigger event detector such as an oscilloscope or a logic analyzer.

Although the real-time trigger figure-of-merit indicator was depicted in the Figures as a vertical bar, it will be appreciated that in other embodiments the indicator may have a different visual appearance, e.g., it may be a horizontal bar, a dial, and so on.

In various embodiments, the processor 345 may be implemented in hardware, software, or a combination of the two, and may comprise a general purpose microprocessor, a digital signal processor (DSP), an application specific integrated circuit (ASIC), a field-programmable gate array (FPGA), or the like.

It will be appreciated from the foregoing discussion that the present invention represents a significant advance in the field of triggers for test and measurement instruments. Although specific embodiments of the invention have been illustrated and described for purposes of illustration, it will be understood that various modifications may be made without departing from the spirit and scope of the invention. Accordingly, the invention should not be limited except as by the appended claims.

What is claimed is:

1. A real-time trigger figure-of-merit indicator comprising:
   a first marker that indicates a real-time trigger figure-of-merit that is calculated based on digitized samples that represent a signal-under-test; and
   a second marker that indicates a level that the figure-of-merit must exceed in order for a trigger event detector to detect a trigger event and generate a trigger signal.

2. A trigger figure-of-merit indicator as in claim 1 further comprising a third marker that indicates a state of the trigger event detector.

3. A real-time trigger figure-of-merit indicator as in claim 1 wherein the trigger event detector is selected from the group consisting of a power level trigger, a filtered power level trigger, a frequency mask trigger, a density trigger, a modulation domain trigger, an external trigger, a data pattern trigger, and a spectral signature trigger.

4. A test and measurement instrument having a real-time trigger figure-of-merit indicator according to claim 1.

5. A test and measurement instrument as in claim 4 wherein the test and measurement instrument is a test and measurement instrument selected from the group consisting of a spectrum analyzer, an oscilloscope, and a logic analyzer.

6. A test and measurement instrument as in claim 4 wherein the real-time trigger figure-of-merit indicator is displayed on a display means selected from the group consisting of a display device and a front-panel.

* * * * *